United States Patent [19]

Zapisek et al.

[11] Patent Number: 4,516,040
[45] Date of Patent: May 7, 1985

[54] HIGH-SPEED MERGED PLANE LOGIC FUNCTION ARRAY

[75] Inventors: John M. Zapisek, Hauppauge; Gus Giulekas, West Hempstead, both of N.Y.

[73] Assignee: Standard Microsystems Corporation, Hauppauge, N.Y.

[21] Appl. No.: 502,724

[22] Filed: Jun. 9, 1983

Related U.S. Application Data

[62] Division of Ser. No. 388,160, Jun. 14, 1982, Pat. No. 4,409,499.

[51] Int. Cl.³ ............... H03K 19/177; H03K 19/094; G06F 7/48
[52] U.S. Cl. .................... 307/468; 307/450; 364/716; 357/41; 357/45
[58] Field of Search ............ 307/450, 468, 279; 364/716; 365/72, 103, 104

[56] References Cited

U.S. PATENT DOCUMENTS

| | | | |
|---|---|---|---|
| 4,084,105 | 4/1978 | Teranishi et al. | 307/468 X |
| 4,123,669 | 10/1978 | Devine et al. | 307/450 |
| 4,207,616 | 6/1980 | Heeren | 307/468 X |
| 4,245,324 | 1/1981 | Machol et al. | 307/468 X |

FOREIGN PATENT DOCUMENTS 136452 11/1978 Japan .................. 364/716

OTHER PUBLICATIONS

Kawagoe et al., "IEEE-JSSC, Minimum Size ROM Structure Compatible with Silicon-Gate E/D MOS LSI"; IEEE-JSSC vol. SC.11, No. 3, pp. 360-364, 6/76.
Balasubramanian et al., "Program Logic Array with Metal Level Personalization"; IBM Tech. Discl. Bull; vol. 19, No. 6, pp. 2144-2145; 11/1976.
Kelly et al., "Dual-Gate Programmable Logic Array"; IBM Tech. Discl. Bull.; vol. 17, No. 10, pp. 2957-2958; 3/1975.
Cook et al., "PLAs Using Polysilicon-Gate FETs"; IBM Tech. Discl. Bull.; vol. 20, No. 4, pp. 1640-1643; 9/1977.
Greenspan et al., "Merged and/or Array PLA Using Double Polysilicon FET Process"; IBM Tech. Discl. Bull.; vol. 23, No. 6, pp. 2189-2191; 11/1980.
Kraft et al., "Method of Personalization Programmed Logic Arrays Using Multiple Levels of Polysilicon"; IBM Tech. Discl. Bull.; vol. 23, No. 3, pp. 881-882; 8/1980.
Conrad et al., "Programmable Logic Array with Increased Personalization Density"; IBM Tech. Discl. Bull.; vol. 19, No. 7, pp. 2628-2629; 12/1976.
Balasubramanian et al., "Increasing Chip Density by Space Sharing of Programmed Logic Arrays"; IBM Tech. Discl. Bull.; vol. 20, No. 10, pp. 4016-4018; 3/1978.

Primary Examiner—Larry N. Anagnos
Attorney, Agent, or Firm—Hopgood, Calimafde, Kalil, Blaustein & Judlowe

[57] ABSTRACT

A programmable logic array includes a plurality of MOS switching devices formed at preselected locations in an array made up of input and output lines and intersecting product term lines. One group of MOS devices constituting the "AND" plane arranged at the intersections of the input lines and product term lines performs a logic operation on input signals to the array and outputs logic signals onto the product term lines. A second group of MOS devices constituting the "OR" plane located at the intersections of the output lines and product term lines receives the outputs of the "AND" plane devices and performs a logic operation on those signals to produce a set of output signals that are presented at the outputs of the array for use by an external device. The merged plane array of the invention advantageously includes dual-gate MOS devices as switching elements to reduce the capacitance on the product term lines and output lines and thereby to increase the operating speed of the array. The input and output lines and related MOS devices of the array rather than being arranged in physically separate and distant input "AND" and output "OR" planes, as in the prior art, are interspersed or merged with one another so as to reduce the amount of interconnect required between the logic array and an external device which provides the inputs to the array and receives the outputs therefrom.

3 Claims, 11 Drawing Figures

HIGH-SPEED MERGED PLANE LOGIC FUNCTION ARRAY

This is a division of application Ser. No. 388,160 filed June 14, 1982, now U.S. Pat. No. 4,409,499.

The present invention relates generally to logic circuits, and more particularly to a programmable logic array.

A programmable logic array is a circuit that has the generality of a memory for implementing a predetermined set of logic functions. A conventional MOS programmable logic array consists of an array of MOS switching devices selectively formed at the intersections of an array of lines arranged in rows and columns to implement a predetermined or preprogrammed logic function.

The conventional programmable logic array consists of two physically separate and distinct areas or "planes", an "AND" plane, which performs logic operations on the inputs to the array, and an "OR" plane which receives the outputs from the "AND" plane and performs a second logic operation on those signals to produce the output signals of the array which represent a desired logic function of the input to the array.

The logic operations implemented in the "AND" and "OR" planes of the conventional programmable logic array are typically performed by MOS FETs connected to the input and output lines, respectively, and interconnected by means of product term lines which run orthogonal to the input and output lines and connect the outputs of the "AND" plane MOS devices to the inputs of the "OR" plane MOS devices. Because MOS circuit layout is more amenable to NOR gates than either to AND or NAND gates, a NOR gate is typically used as the logic device in both the "AND" and "OR" planes. Logical equivalence is maintained because a product term generated by a NOR gate can be considered to be the AND of the NOTs of its inputs, and because an output generated by a NOR gate is the NOT of the OR of its inputs.

Programmable logic arrays of this type are commonly employed in association with clocked memories or registers to implement a finite state machine. In this arrangement, the outputs of the clocked memory are applied to the input MOS devices in the "AND" plane of the logic array, and the logic outputs of the "OR" plane devices are connected back to the memory to update the data stored in the memory. The updated data is then applied as a new input to the logic array and the process is repeated for each clock cycle.

This arrangement of a conventional logic array and clocked memory requires the use of two interconnect lines, one to connect the output of the memory to the inputs of the "AND" plane of the array and a second to connect the outputs of the physically separated "OR" plane of the array to the inputs of the memory. This arrangement causes the inputs of the memory to be inconveniently physically located with respect to the locations of its outputs, and also necessitates a relatively large space for fabricating the interconnect wiring. The latter requirement results in an increased use of chip area, which, in turn, increases the cost of the product.

It is an object of the present invention to provide a programmable logic array which, when connected to an external memory, requires less material for implementing and interconnect, and is lower in cost.

It is another object of the invention to provide a programmable logic array that can be more conveniently and economically interconnected with an external component such as a clocked memory.

It is a further object of the invention to provide a programmable logic array that is capable of operating at high speeds.

To these ends, in the programmable logic array of the invention the input "AND" and output "OR" planes rather than being physically separated and distinct, as in the prior art, are interspersed or merged with one another. More specifically, in the logic array of the invention the input and output lines may be arranged in an alternating sequence so that inputs to and outputs from the thus merged "AND" and "OR" planes of the array can be respectively directly connected to an external memory or register by a more efficient and less costly interconnect. The programmable logic array also includes a novel dual-gate MOS device as a switching element to reduce the capacitance on the product term and output lines and thereby increase the operating speed of the array.

To the accomplishment of the above and such further objects as may hereinafter appear, the present invention relates to a programmable logic array substantially as defined in the appended claims, and as described in the following specification as considered with the accompanying drawings in which:

Figure 1:
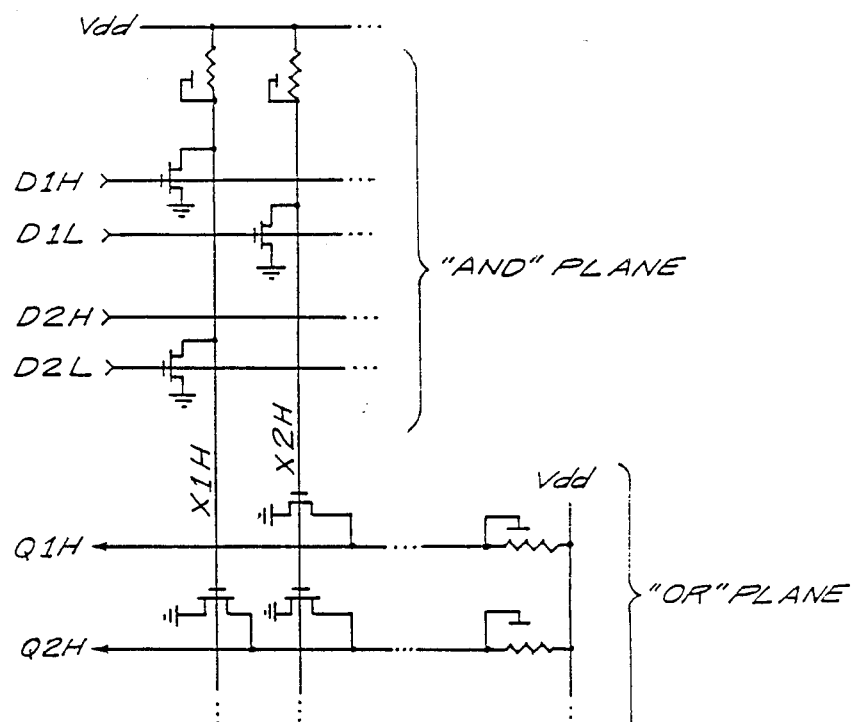
FIG. 1 is a schematic diagram of a portion of a programmable logic array.

FIG. 1 illustrates a portion of a programmable logic array according to the prior art, which includes a plurality of parallel input and output wires or lines and a plurality of orthogonal product term lines intersecting the input and output lines. Switching or logic devices, typically in the form of MOS FETs, implementing a NOR gate, are formed at preselected intersections of the array. FIG. 1 illustrates four input lines D1H, D1L, D2H, and D2L; two output lines Q1H and Q2H; and two intersecting product term lines X1H and X2H. MOS devices are shown in FIG. 1 as being located at the intersections of input lines D1H and D2L with product term line X1H; input line D1L with product term line X2H; output line Q1H with product term line X2H; and output line Q2H with product term lines X1H and X2H.

As can be seen in FIG. 1, the input and output lines and their associated MOS devices are arranged in physically separate and distinct areas in the array, which are designated the "AND" and "OR" planes. The MOS devices in the "AND" and "OR" planes are interconnected by means of the product term lines. As shown in FIG. 1, each of the MOS switching devices in the input "AND" plane have their gates connected to one of the horizontal input lines and their drains connected to an orthogonal or vertical product term line. Each of the MOS devices in the output "OR" plane have their gates connected to one of the product term lines and their drains connected to one of the output lines. The sources of all the FETs in both the "AND" and "OR" planes are connected to ground. The output and product term lines are also connected through MOS pull-up load devices to a voltage source Vdd.

The MOS devices in the "AND" plane receive the inputs from an external source, such as a clocked memory in the form of high (H) or low (L) signals, and implement a predetermined logic operation on these inputs as a function of the arrangment of the MOS devices in that plane. The outputs of the "AND" plane devices are applied through the product term lines to the MOS devices in the "OR" plane, the outputs of which constitute the outputs of the array and are returned as inputs to the external circuit.

Figures 2, 3:
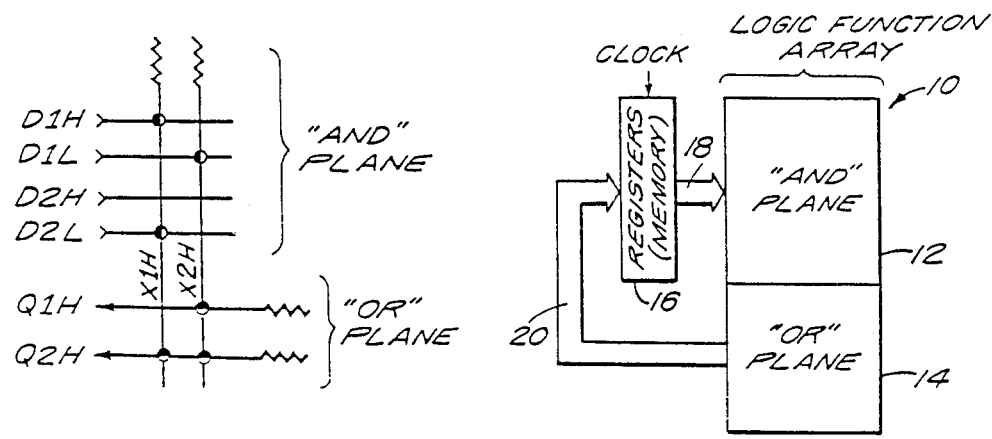
FIG. 2 is a more compact schematic diagram of the programable logic array of FIG. 1.
FIG. 3 is a conventional arrangement of a prior art programmable logic function array interconnected with a clocked memory register to implement a finite state machine.
Figure 6:
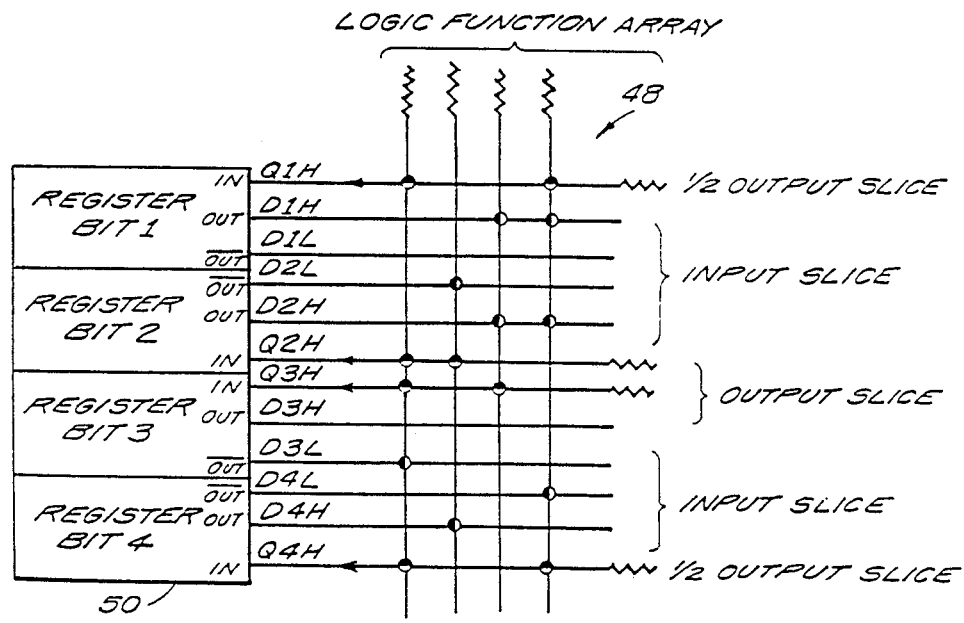
FIG. 6 is a schematic diagram of a merged plane programmable logic array in accordance with an embodiment of the invention which provides pairing of complementary outputs and inputs.

FIG. 2, which functionally and schematically illustrates the logic array shown in FIG. 1, employs a more compact representation of the MOS switching devices than that used in FIG. 1 so as to simplify the diagram. This compact representation of MOS devices is also used in the schematic diagrams of FIGS. 4 and 6, which schematically illustrate merged-plane programmable logic arrays. Thus, in FIGS. 2, 4, and 6, the MOS FETs are depicted by the presence of a circle at the intersections of two lines or wires. The orientation of the circle with respect to the wires illustrates the manner of connection of the MOS device. That is, a wire shown perpendicular to the axis of the semicircle is connected to the gate of the MOS FET, whereas a wire shown parallel to the semicircle axis is connected to the drain of the transistor. The connections of the sources of each of the FETs to ground is not shown in the simplified schematic diagrams of FIGS. 2, 4, and 6, nor are the connections of the drains and gates of the load devices, which are illustrated as resistors in these diagrams.

FIG. 3 illustrates a typical connection of a conventional logic function array 10, which includes an input "AND" plane 12 and a physically distinct and separate "OR" plane 14 connected to a clocked memory or register 16 to form a finite state machine. As shown, the data stored in memory 16 is applied on an input data bus 18 to the MOS logic devices in the "AND" plane 12, and the outputs of the logic function array 10 derived from the output "OR" plane 14 are applied to the memory 16 by means of an output data bus 20. The data in memory 16 is periodically updated by the signals it receives from the outputs of the "OR" plane devices in logic array 10.

This arrangement of a programmable logic array and clocked memory requires a relatively large area to interconnect the outputs of the array 10 to the inputs of the memory 16, which results in a corresponding high cost to fabricate the unit. A merged-plane programmable logic array, as shown in simplified form in FIG. 4, and generally designated by reference numeral 22, permits the connection of the outputs of the array to a clocked memory 24 (shown as including two bits in FIG. 4), with the use of significantly less interconnect area and less cost than in the conventional arrangement. To this end, in the merged plane programmable logic array, the input and output lines and associated MOS logic devices are implemented in merged or interspersed "AND" and "OR" planes rather than in physically separate and distinct "AND" and "OR" planes, so that less space is required to connect the input and output lines of the logic array to the outputs and inputs of an external data unit, such as a clocked memory. Thus, as shown in FIG. 4, the input "AND" lines D1H, D1L, D2H and D2L, and the output "OR" lines Q1H and Q2H of array 22 are merged or interspersed with one another; that is, rather than all the input lines being in one area or "AND" plane, and all the output lines being in another area of "OR" plane, the output and input lines are arranged in an alternating fashion so that the "AND" and "OR" planes become merged.

Figure 4:
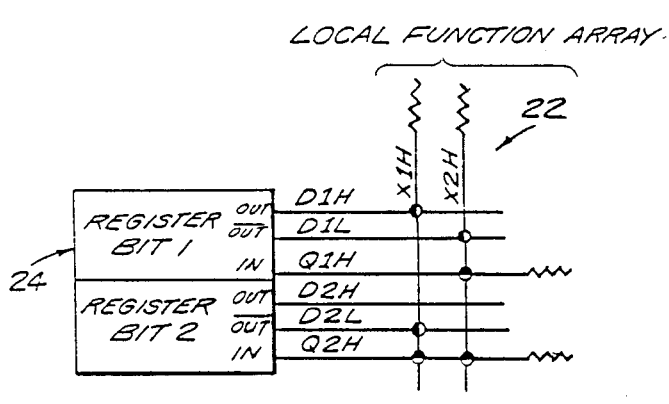
FIG. 4 is a schematic diagram of a merged plane programmable logic array.

For each bit of memory 24, e.g., bit 1, the merged programmable logic array of FIG. 4 provides a horizontal input-output slice comprised of a complementary-input subslice (D1H and D1L) directly connected to the outputs of this bit, and an output subslice Q1H directly connected to the input of this bit. Similar connections are made between the input and output lines of the array to bit 2 of the memory 24. This direct connection of the inputs and outputs of the array and the outputs and inputs of the memory, as shown in FIG. 5, eliminates the interconnect in the vertical direction from the outputs of the programmable logic array to the inputs of the memory as is required in the nonmerged logic function array illustrated in FIG. 3.

Figure 5:
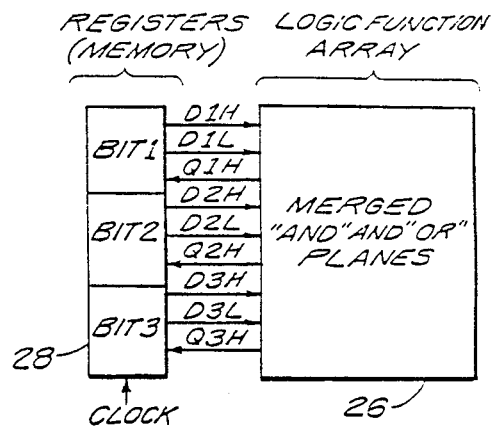
FIG. 5 is a simplified diagram illustrating the interconnection of the merged plane logic array and the inputs and outputs of a clocked memory.

FIG. 5 illustrates in block form a logic function array 26, which has merged "OR" and "AND" planes. The array 26 is shown connected to a three-bit clocked register 28 to receive from register 28 signals to its input "AND" plane in the form of complementary input pairs D1H, D1L; D2H, D2L; and D3H, D3L. Array 26 operates on those input signals in accordance with the arrangement of the MOS logic devices in the merged "AND" and "OR" planes to produce outputs Q1H, Q2H, and Q3H, which are connected directly to the inputs of the respective bits of register 28. The reduction in the area of interconnect required to connect the inputs and outputs of the merged-plane programmable logic array 26 to the outputs and inputs of the external register 28 is readily seen from a comparison of the layout diagram of FIG. 5 and the nonmerged arrangement of FIG. 3.

The merging of the "AND" and "OR" planes in the programmable logic array does, however, introduce an additional design restriction in that the product term wires, (e.g. X1H and X2H in FIG. 4) must be constructed of low-resistivity material. This restriction is not present in the nonmerged programmable logic array because the output devices in the "OR" plane (which sense the voltage on the product term wires) are not physically located between the input devices in the "AND" plane (which apply ground to the product term wires) and the load devices (which apply the source voltage Vdd through a resistance to the product term wires). The merged-plane logic function array of FIG. 4 contains output device locations (e.g., the intersections of output line Q1H with product lines X1H and X2H which are physically located between the product term load devices and input device locations (e.g., the intersections of input line D2L with product term wires X1H and X2H).

Any appreciable resistance of a product term wire between an input device and an output device will form a voltage divider which can seriously degrade the logic-zero voltage level produced at the output device by the input device (provided that the input device is further from the load device than the output device). Programmable logic arrays are of sufficient size such that both polysilicon and mesa (N+diffusion) may be too highly resistive for use as the product term wires. Therefore, metal interconnect (e.g., aluminum) can be used for these wires as can metal-polysilicon compositions (e.g., titanium silicide), which also have sufficiently low resistivity.

To achieve high-speed operation of the MOS devices in the array, means are provided to reduce the parasitic capacitance on the input, product term, and output lines. The use of metal, which has a low capacitance-per-unit area to the substrate, for the product term wires helps to increase the speed of the array. Polysilicon, which has the next lowest parasitic capacitance (about double that of metal but still less than mesa or doped silicon), is used for the input and output wires since metal cannot be used for these wires because the product term and ground wires use metal and run perpendicular to the input and output wires. The high resistivity of polysilicon is tolerable because (a) in the case of the input wires, no D.C. load is present, and (b) in the case of the output wires, the output signal is taken at the opposite end of the array from the output load devices. The relatively highly resistive input and output wires is, however, still a possible source of difficulty because it reduces to some extent the speed of the array.

Figure 9:
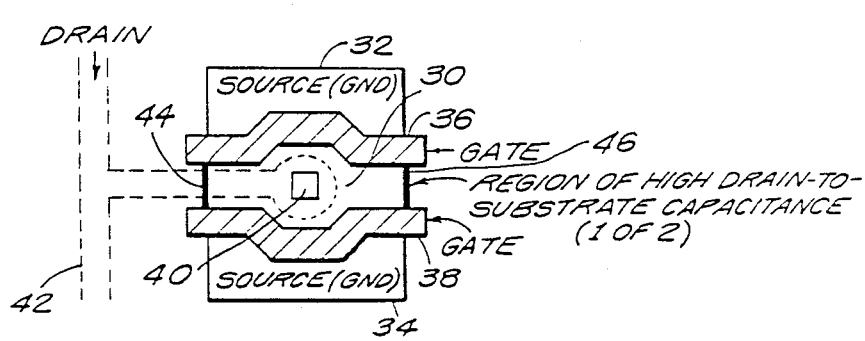
FIG. 9 is a plan view of a double MOS device structure used in the merged-plane logic array.

To improve on this situation, the capacitance of the input and output MOS devices is reduced to further increase the operational speed of the array. As shown in FIG. 9, the MOS devices employed in the programmable logic array of the invention are dual-gate devices in which a common drain area 30 and two spaced source areas 32, 34 of doped silicon or mesa are formed in a silicon substrate (not shown). A pair of gates 36 and 38 formed of polysilicon are arranged over and insulated from the source and drain areas. The polysilicon gates 36, 38 are spaced as close to one another as possible and are bent outwardly away from another at their central regions to allow a drain contact 40 to be positioned between the gates for connection to the common drain area. Drain contact 40 is, in turn, connected to a drain metal interconnect 42, which connects the MOS device to a product term line if the device is in the "AND" plane, or to an output line if the device is in the "OR" plane of the array. Mesa, the material used for the drains and sources of the MOS devices employed as logic elements in the array, has a very high capacitance-per-unit-length to the substrate where it borders field oxide (all non-mesa areas). These regions are shown by the heavy lines 44, 46 in FIG. 9. The mesa-to-field oxide borders associated with the source are also highly capacitive, but source-to-substrate capacitance does not affect the speed of the array because both nodes are at the equivalent of A.C. ground. For this reason, no attempt is made to limit the area of the source mesa or the length of the source-mesa-to-field oxide border.

Since drain-to-substrate capacitance directly degrades the speed performance of the array, the double MOS device arrangement of FIG. 9 is used for both input and output MOS devices in the merged "AND" and "OR" plane of the array of the invention. By sharing a common drain mesa between two MOS devices, the length of the drain-mesa-to-field-oxide border is reduced to less than what two separate devices would normally have, and even less than what a single MOS device would normally have. The spacing between gate 36 and gate 38 at the ends of the double MOS device is kept to the minimum allowed by the process design rules, and is increased in the central region only enough to allow drain contact 40 between the drain mesa and metal to be reliably made. This is done to reduce the drain mesa area and drain-mesa-to-field-oxide border length to their minimums.

The use of the double MOS device structure of FIG. 9, however, tends to complicate the layout and use of the array. First, since each input slice contains two complementary input wires, at no time are both wires connected to MOS devices on the same product term. Since one wire of the complementary pair is always high, connecting them both to devices on the same product term would cause that product term always to be low. Therefore, space for only one MOS device is required wherever a pair of complementary input signals cross a product term wire. The effective use of the double device structure of FIG. 9, therefore, requires that complementary input pairs be grouped in pairs. This can be achieved by reflecting every other register bit along a horizontal axis as shown in the merged plane logic function array 48 in FIG. 6, in which the inputs and outputs of the array are connected to a four-bit register 50. In array 48, each horizontal input slice is able to handle the complementary outputs (e.g., D1H and D1L) of the two register bits.

Figure 7A:
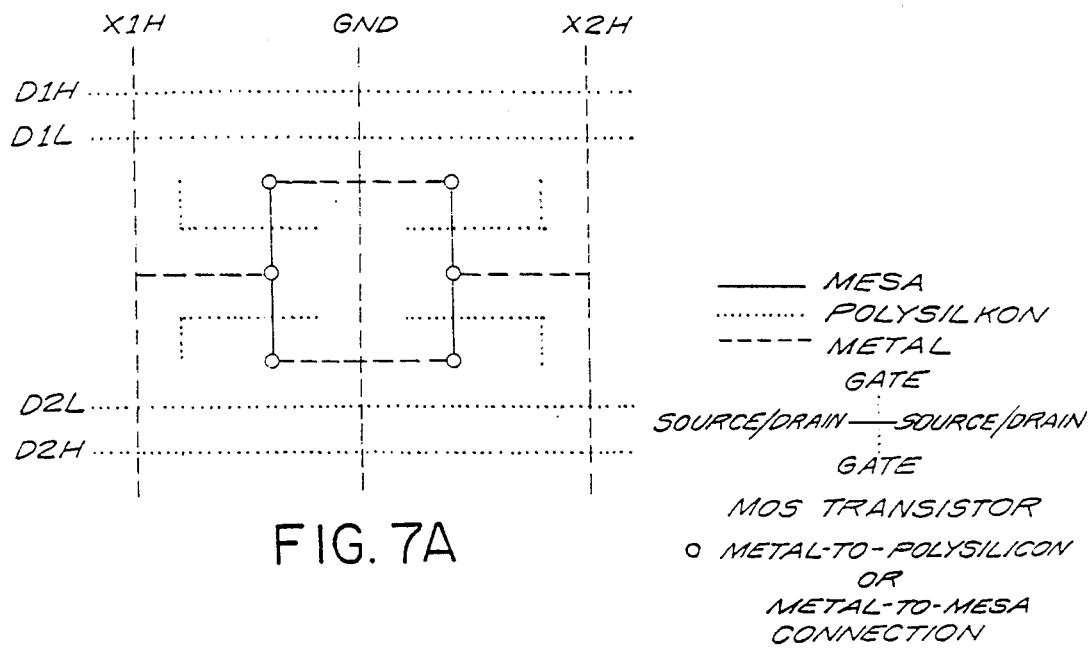
FIGS. 7A and 7B illustrates the steps in programming the dual-gate MOS devices of the logical "OR" plane of a merged plane logic array in accordance with an aspect of the invention.
Figure 7B:
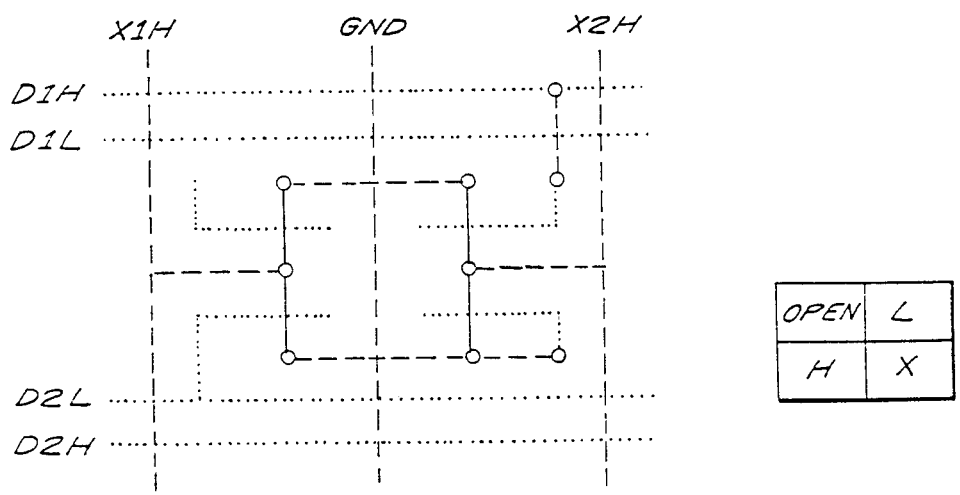

The input slice cell layout used to incorporate the double device structure of FIG. 9 is shown unprogrammed in FIG. 7A. As noted previously, the product terms and ground run vertically on metal and the input wires run horizontally on polysilicon. A typical programming of the input cell of FIG. 7A is shown in FIG. 7B with an open gate although this device would typically not be used in this way. The lower left device is shown connected via polysilicon to input wire D2L and represents an "H" or logic high in the programming of the "AND" plane. (This reversal occurs because the "AND" plane is constructed with NOR gates: for product term wire X1H to be high, input D2L must be low, meaning that input D2H must be high). The upper right device is shown connected via polysilicon and metal to input D1H and similarly represents an "L" or logic low in the programming of the "AND" plane. The lower right device is shown connected via polysilicon and metal to ground and represents an "X" (don't care) in the programming of the "AND" plane. If both the upper and lower devices on either the left or right halves are programmed "X", then both devices can be eliminated. This reduces the capacitance on the product term wires and further improves the operating speed of the array.

Figure 8A:
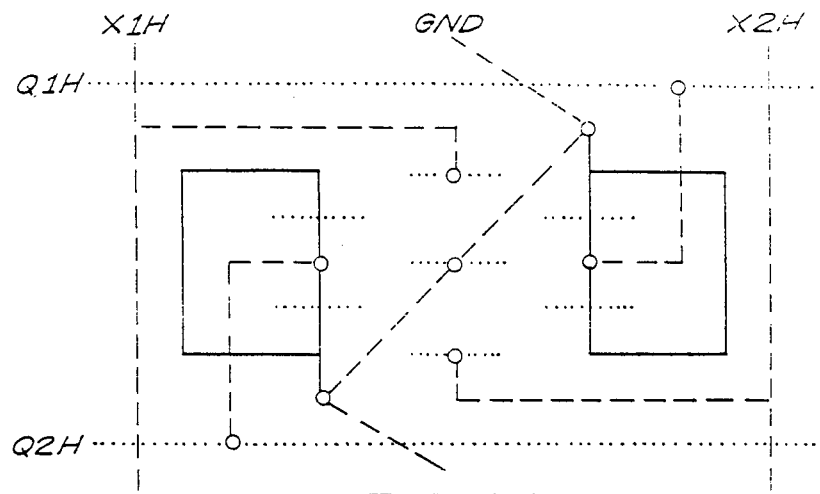
FIGS. 8A and 8B illustrate the steps in programming the dual-gate MOS devices of the logical "AND" plane of a merged-plane progammable logic array in accordance with the invention.
Figure 8B:
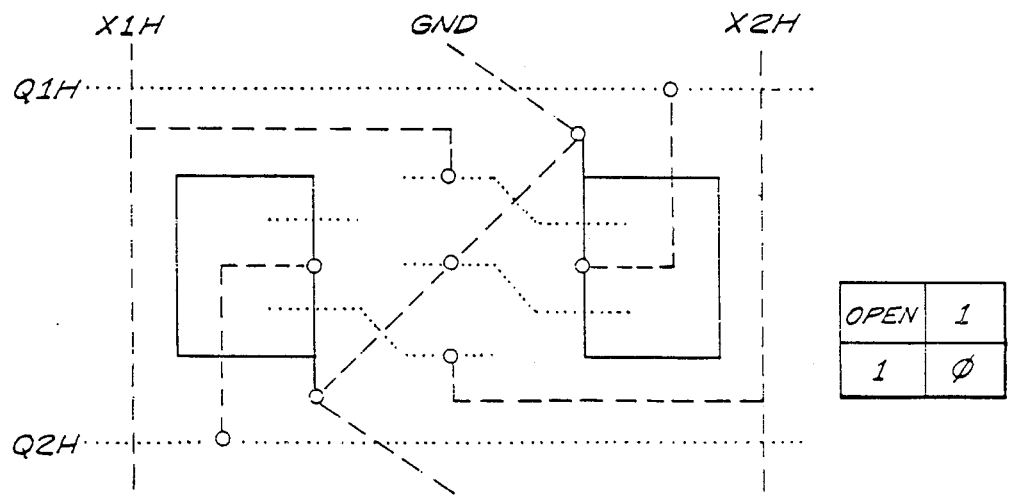

In order to share a common ground between two product terms, the product terms are advantageously paired, and the desire to effectively use the double device MOS structure of FIG. 9 for the output requires this pairing. The reflection of alternate register bits to achieve pairing of complementary outputs (inputs to the array) also produces pairing of register inputs as in FIG. 6. The output slice cell layout used to accommodate these pairing requirements is shown unprogrammed in FIG. 8A. The use of the same arrangement of vertical connections as the input slice cell allows input slices and output slices to be stacked vertically in any convenient order, as required by the merging of the "AND" and "OR" planes. The programming of the output slice cell is shown in FIG. 8B, in which the upper left device is shown with an open gate and would typically not be used in this way. The lower left and upper right devices are shown connected via polysilicon to product terms X2H and X1H, respectively. These represent "1"s in the programming of the "OR" plane. (The assertion of the product term will cause the output wire to go low.) The lower right device is sh.own connected via polysilicon to ground. This represents a "0" in the programming of the "OR" plane. (The assertion of product term X2H will have no effect on output wire Q1H.) If both the upper and lower devices on either the left or right halves are programmed "0", then both devices can be eliminated. This reduces the capacitance of the output wires again improving speed.

It will be understood that the merged programmable logic array of the invention has been hereinabove disclosed with reference to several preferred embodiments. It will accordingly also be appreciated that modifications to the embodiments specifically described may be made without necessarily departing from the spirit and scope of the invention.

What is claimed is:

1. A method of programming a logic array including an "AND" plane and an "OR" plane, said method comprising the steps of (a) providing an array of parallel polysilicon input and output lines and a plurality of orthogonal metal ground and product-term lines, said input lines being grouped into closely spaced pairs, each of said input line pairs comprising input lines for carrying the true and complement of each input signal, said input line pairs being grouped to constitute an input row comprising input line pairs separated by a sufficient space to allow the formation of transistor pairs between the input line pairs, said output lines being grouped to constitute an output row comprising output lines separated by a sufficient space to allow the formation of transistor pairs between the output lines, said metal lines constituting a product-term column comprising two product-term lines and a central ground line separated by a sufficient space to allow transistor pair formation between at least one of said product-term lines and central ground line, (b) programming said "AND" plane by forming input transistor pairs within the intersections of said input rows and said product-term columns, said input transistor pairs comprising MOS transistors having grounded source terminals, separate gate terminals, and a common drain terminal, said grounded source terminals being connected to the central metal ground line of the containing product-term column, said gate terminal of each of said MOS transistors being connected to ground or to the true or complement input line of one of said input line pairs of the containing input row, said common drain terminal being connected to one of said product-term lines of the containing product-term column, and (c) programming said "OR" plane by forming output transistor pairs within the intersections of said product-term columns and said output rows, said output transistor pairs comprising MOS transistors having grounded source terminals, separate gate terminals, and a common drain terminal, said grounded source terminals being connected to the central metal ground line of the containing product-term column, said gate terminal of each of said MOS transistors being connected to ground or to one of the product-term lines of the containing product-term column, said common drain terminal being connected to one of the output lines of the containing output row.

2. The method of claim 1, further comprising the step of preventing the formation and connection of any transistor pair which has both of its gate terminals grounded.

3. The method of claim 1, in which said parallel polysilicon lines and the gates of said transistor pairs are fabricated from a more highly conductive material than polysilicon, said highly conductive material including a metal silicide.

* * * * *